United States Patent
Ecton et al.

(10) Patent No.: US 11,404,389 B2
(45) Date of Patent: Aug. 2, 2022

(54) IN-SITU COMPONENT FABRICATION OF A HIGHLY EFFICIENT, HIGH INDUCTANCE AIR CORE INDUCTOR INTEGRATED INTO SUBSTRATE PACKAGES

(71) Applicant: Intel Corporation, Santa Clara, CA (US)

(72) Inventors: Jeremy Ecton, Gilbert, TX (US); Suddhasattwa Nad, Chandler, AZ (US); Kristof Darmawikarta, Chandler, AZ (US); Yonggang Li, Chandler, AZ (US); Xiaoying Guo, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 16/147,563

(22) Filed: Sep. 28, 2018

(65) Prior Publication Data

US 2020/0105685 A1 Apr. 2, 2020

(51) Int. Cl.
  *H01L 23/64* (2006.01)
  *H01L 23/532* (2006.01)
  *H01L 23/522* (2006.01)
  *H05K 1/16* (2006.01)

(52) U.S. Cl.
  CPC ........ *H01L 23/645* (2013.01); *H01L 23/5227* (2013.01); *H01L 23/5329* (2013.01); *H05K 1/165* (2013.01)

(58) Field of Classification Search
  CPC .... H01L 23/645; H01L 23/5227; H05K 1/165
  USPC ......................................................... 257/531
  See application file for complete search history.

(56) References Cited

U.S. PATENT DOCUMENTS

| | | | |
|---|---|---|---|
| 2009/0160018 A1* | 6/2009 | Nabeshima | H01L 23/5227 257/531 |
| 2016/0005526 A1* | 1/2016 | Im | H05K 1/181 174/260 |

* cited by examiner

*Primary Examiner* — Quoc D Hoang
(74) *Attorney, Agent, or Firm* — Schwabe, Williamson & Wyatt, P.C.

(57) ABSTRACT

Embodiments include one or more air core inductors (ACIs) and a method of forming the ACIs. The ACI includes a first inductor loop on a substrate. The first inductor loop has a first line and a second line. The first line has a first thickness that is greater than a second thickness of the second line. The ACI also includes a dielectric over the substrate and the first and second lines. The first line has a top surface above a top surface of the second line. The ACI further includes a second inductor loop on the dielectric and the first inductor loop. The second inductor loop has is coupled to the top surface of the first line of the first inductor loop. The first inductor loop may also have a third thickness, where the third thickness is the distance between the top surfaces of the first and second line.

25 Claims, 9 Drawing Sheets

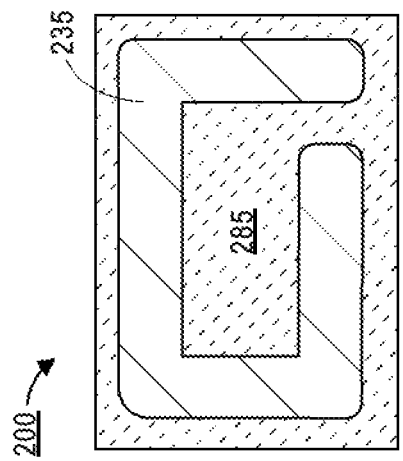
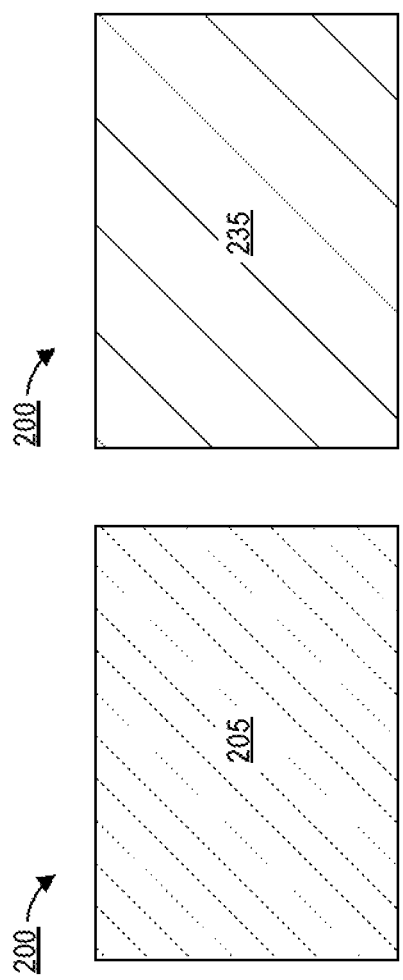
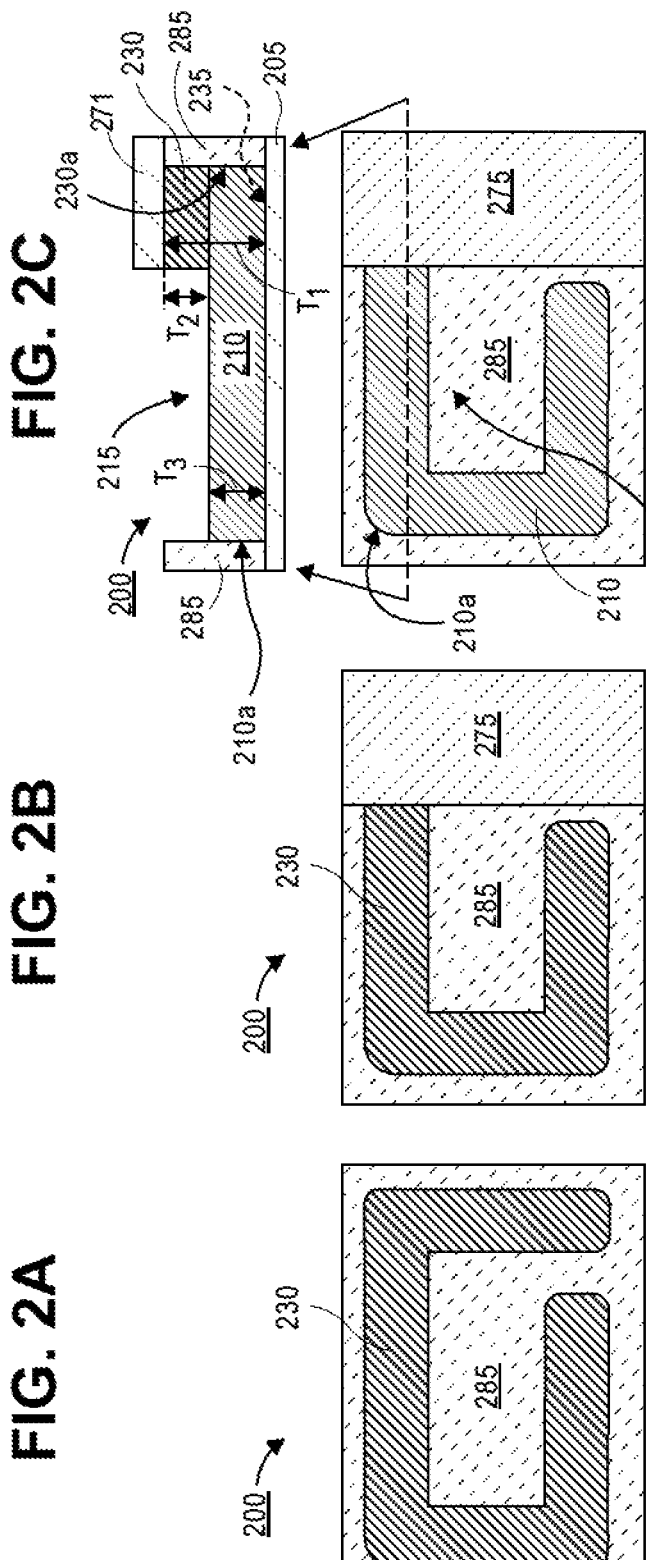

IN-SITU COMPONENT FABRICATION OF A HIGHLY EFFICIENT, HIGH INDUCTANCE AIR CORE INDUCTOR INTEGRATED INTO SUBSTRATE PACKAGES

FIELD

Embodiments relate to packaging semiconductor devices. More particularly, the embodiments relate to semiconductor devices that include air core inductors having inductor loops with different thicknesses.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices typically utilize air core inductors (ACIs) for voltage power regulation. ACIs are generally located on a backside of a package substrate that is opposite to the side on which the semiconductor device is packaged. The ACI may be electrically coupled through the package substrate to a capacitor on the semiconductor device. However, the drive for smaller scaling that is present with each successive generation of semiconductor devices decreases the area available for the ACIs. As the area allotted for the ACIs continues to shrink, crowding induces higher resistive losses in the ACIs and reduces the overall power delivery network's efficiency.

Typically, existing technologies embed ACIs into the build up layers of the package substrate by (i) forming inductor loops in the metal layers as each inductor loop is electrically coupled to the vias in the via layer, or (ii) forming thicker inductor loops as each inductor loop spans between two metal layers and one via layer that has via trenches in between the two metal layers. Such existing technologies, however, limit the design of the ACIs. In particular, the inductor loop to inductor loop spacing and/or the cross-sectional area of the inductor loop may be constrained by the standard patterning process used to form the build-up layers (e.g., a semi-additive process, a laser drill process, etc.). This problem typically leads to a tradeoff between a small cross-sectional area (i.e., a thinner inductor loop) with a large number of inductor loops, or a large cross-sectional area (i.e., a thicker inductor loop) with a smaller number of inductor loops.

Accordingly, these existing technologies are usually required to make tradeoffs between efficiency and absolute inductance. Such tradeoffs, however, may be problematic for future technology nodes that may require both a high inductance (i.e., a large number of loops) and a high efficiency (i.e., a large cross-sectional area).

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are package substrates that include air core inductors (ACIs) with inductor loops having different thicknesses and methods of forming such package substrates. The package substrates described below and methods of forming such package substrates include disposing in-situ one or more inductor loops with etched portions to form ACIs that are embedded in the build-up layers of the package substrates. The embodiments described herein embed the ACIs into the build-up layers of the package substrates using, for example, an over-plate etch back approach/process. Accordingly, these embodiments described herein enable the patterning of an ACI having a large number of inductor loops, and a high cross-sectional area with a small inductor loop to inductor loop spacing, thereby enabling the ACI to provide highly increased inductance and high-efficiency for upcoming technology nodes and applications.

Figure 2G:
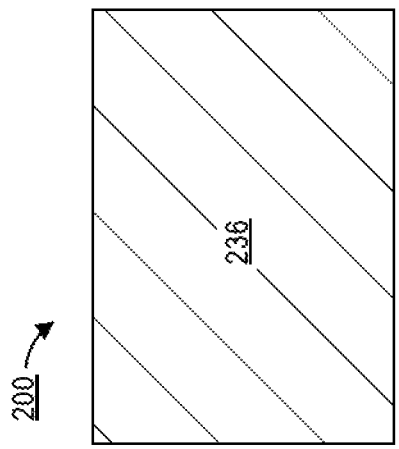
FIGS. 2A-2U are illustrations of plan views of a process flow to form an ACI in build-up layers of a substrate with an over-plate etch back process, according to some embodiments.
Figure 2H:
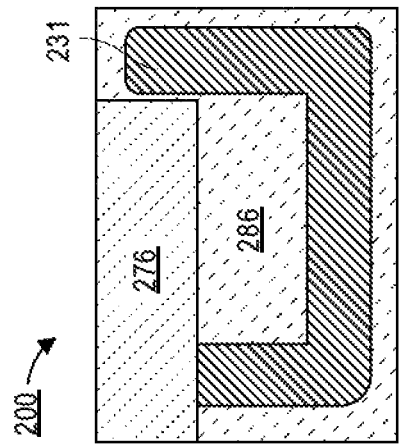
Figure 2I:
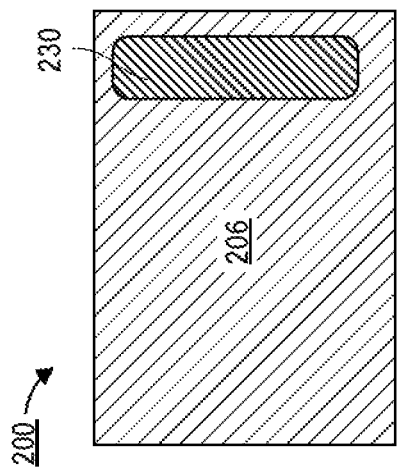
Figure 2J:
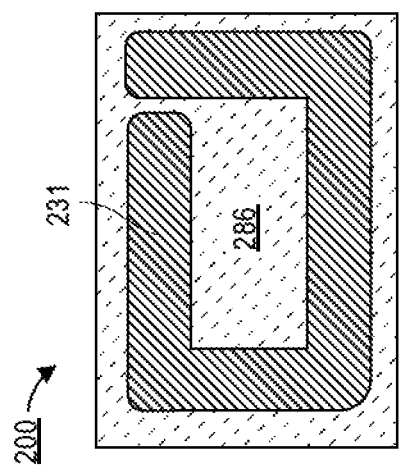
Figure 2K:
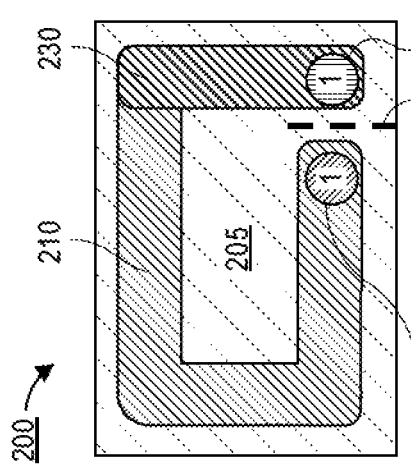
Figure 2L:
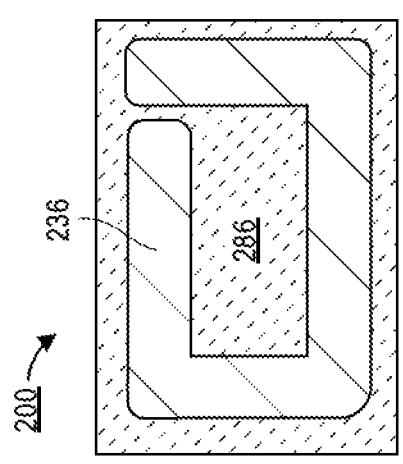
Figure 2M:
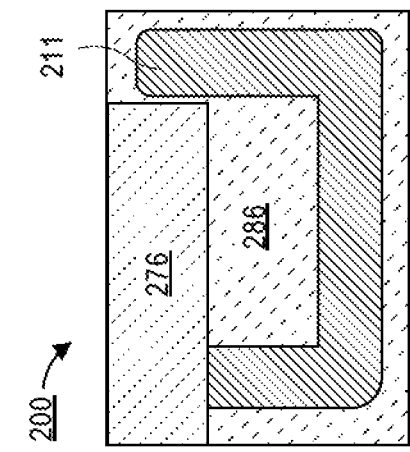
Figure 2N:
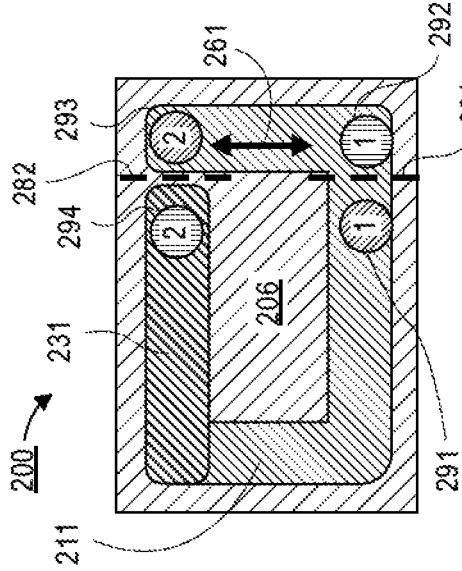
Figure 2O:
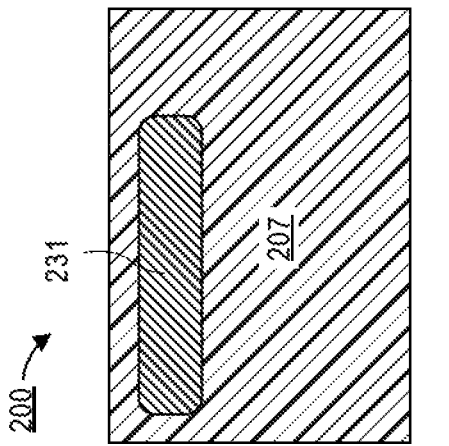
Figure 2P:
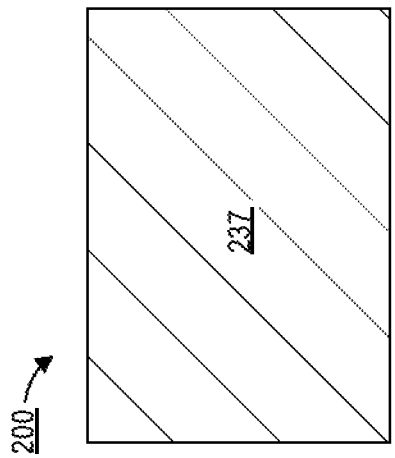
Figure 2Q:
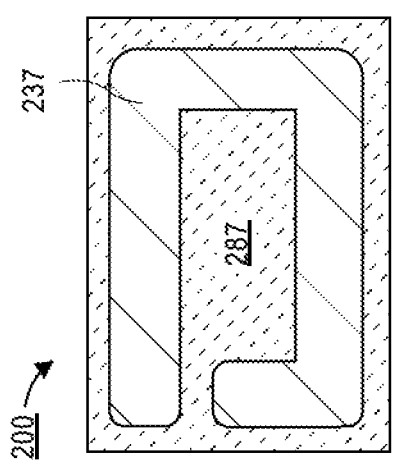
Figure 2R:
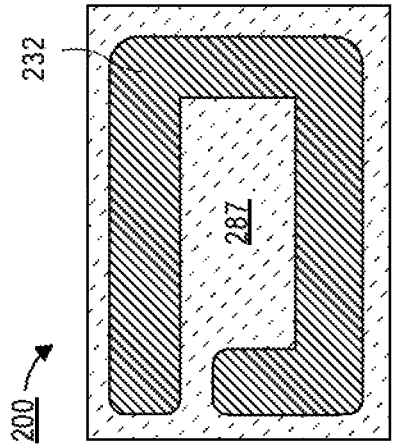
Figure 2U:
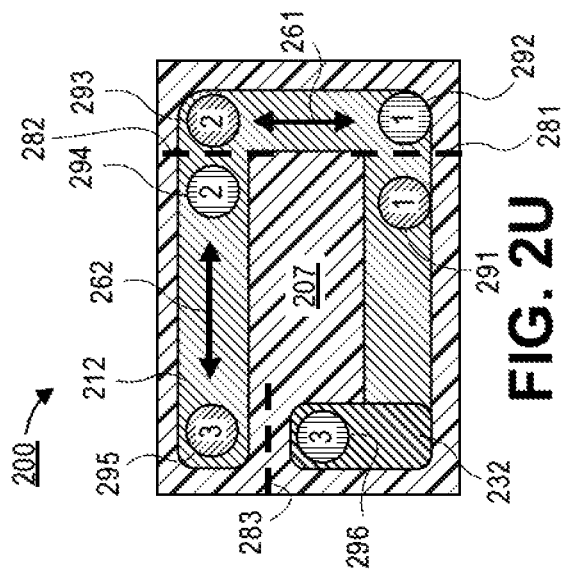

According to some embodiments, a package substrate is described (e.g., the package substrate 200 of FIG. 2U).

Embodiments of the package substrates may include patterning and disposing (or forming) thicker inductor loops with high cross-sectional areas, while the inductor loop to inductor loop spacings are relatively small (e.g., the spacing may be as small/low as approximately 3 um or less, where the spacing may be limited only by the uniformity of the plating thickness and/or planarization process). Furthermore, these embodiments of the ACIs, as described herein, thus improve packaging solutions (i) by enabling substantially small spaces between inductor loops, and (ii) by accordingly allowing the high-density of the inductor loop coils to increase the absolute inductance of the ACIs (i.e., ACIs with higher/increased loop densities—based on smaller spacings between the inductor loops—results in higher inductances).

Another major advantage of these embodiments includes disposing the ACIs in the build-up layers of the package substrates with considerably thicker (or higher) cross-sectional areas (e.g., areas that are approximately two times (2×) thicker/higher or more) while having the same number of inductor loops. This advantage further enhances packaging solutions by improving the electrical performance of the package substrates described herein (or any other semiconductor device utilizing the ACIs described herein) as a result of reducing the total electrical resistance of the ACIs.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including package substrates with one or more ACIs having one or more inductor loops with different thicknesses based on portions of the inductor loops that have been etched (e.g., using an over-plate etch back process shown below in FIGS. 2A-2U).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1A:
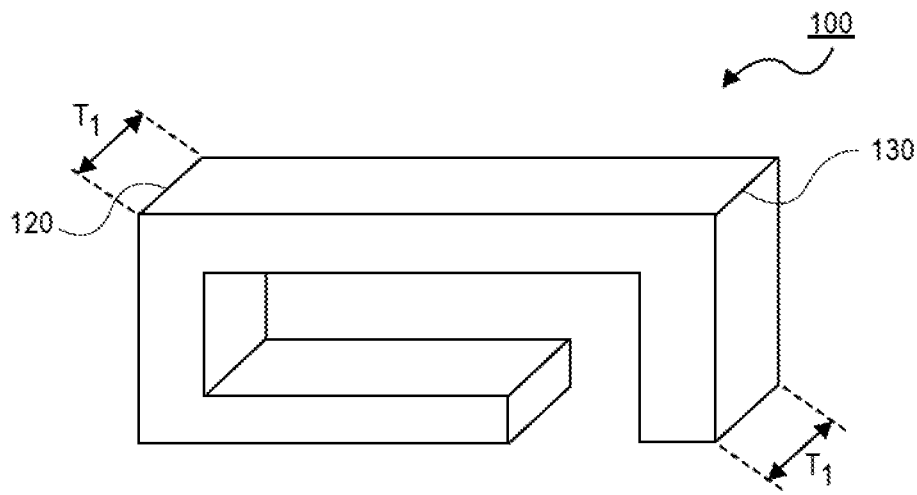
FIG. 1A is an illustration of a three-dimensional (3D) block diagram of an air core inductor (ACI) loop having the same thickness, according to one embodiment.
Figure 1B:
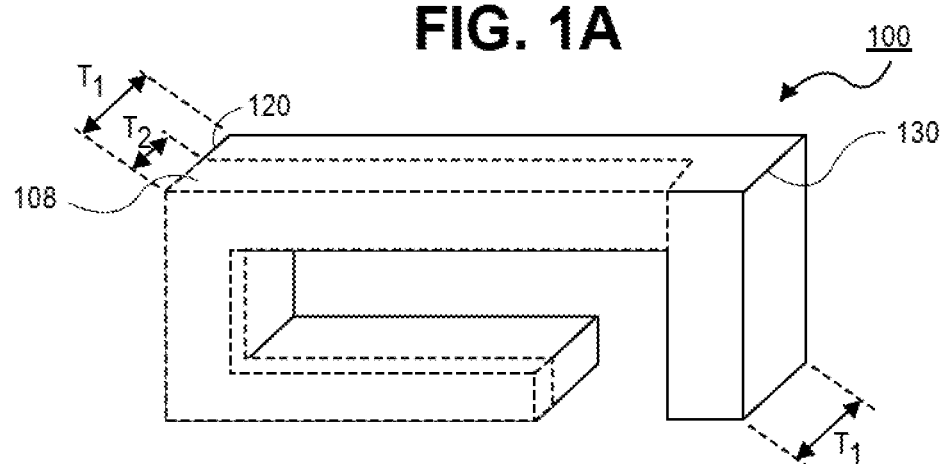
FIG. 1B is an illustration of a 3D block diagram of an ACI loop having a portion that is subsequently etched, according to one embodiment.
Figure 1C:
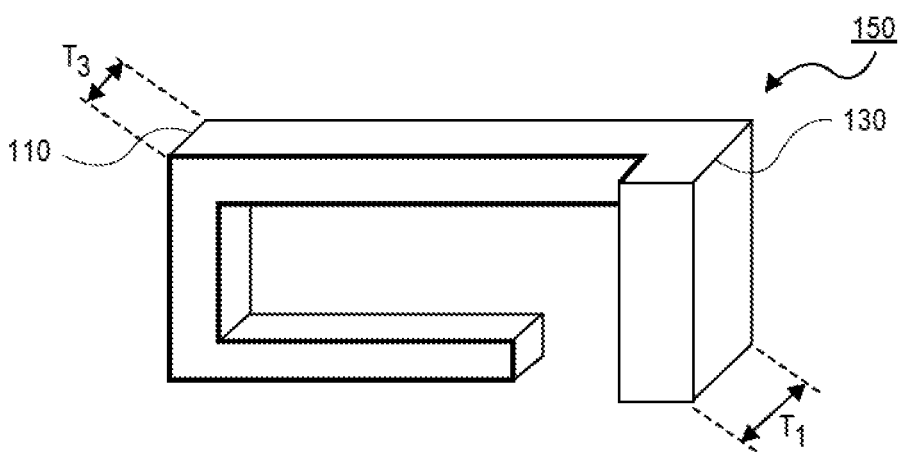
FIG. 1C is an illustration of a 3D block diagram of an ACI loop having different thicknesses after a portion has been etched, according to one embodiment.

FIGS. 1A-1C are illustrations of three-dimensional (3D) block diagrams of a process flow to form an ACI loop having different thicknesses, according to one embodiment. These embodiments as shown with respect to FIGS. 1A-1C provide a simplified process flow of an over-plate etch back approach/process used to form an ACI loop 150 (as shown in FIG. 1C) having different thicknesses $T_1$ and $T_3$ after a portion 108 (as shown in FIG. 1B) of the ACI loop 150 has been etched. Note that well-known features of FIGS. 1A-1C are omitted or simplified in order not to obscure the illustrative implementations.

Referring back to FIG. 1A. According to one embodiment, FIG. 1A is an illustration of a 3D block diagram of an ACI loop 100 having the same thickness $T_1$. In one embodiment, the ACI loop 100 has two outer edges 120 and 130 that are opposite to each other. In this embodiment, the ACI loop 100 may be formed of any conductive material (e.g., copper) using any conventional lithographical process. This formation may be illustrated with the 3D geometrical view of the ACI loop 100 after an electrolytic plating process is implemented. Furthermore, the ACI loop 100 may be one of multiple inductor loops of an ACI. As shown in FIG. 1A, each of the outer edges 120 and 130 of the ACI loop 100 has the same thickness $T_1$, where the $T_1$ may be defined as a thickness (or depth) typically in the z-direction (i.e., the thickness $T_1$ may also be defined as the z-height of the ACI loop 100).

FIG. 1B is an illustration of the 3D perspective view of the ACI loop 100 having a portion 108 that may be subsequently etched, according to one embodiment. In one embodiment, the portion 108 of the ACI loop 100 is illustrated with dashed lines. In this embodiment, the portion 108 may have a thickness $T_2$ that is less than the thickness $T_1$ of the outer edge 120 of the ACI loop 100. As shown in FIG. 1B, the thickness $T_2$ of the ACI loop 100 illustrates the thickness of the portion 108 that is subsequently etched (or partially-etched) as described below.

For example, rather than etching the entire edge 120 of the ACI loop 100 (i.e., etching through the entire thickness $T_1$ of the outer edge 120), the process flow described herein may implement a partial etch to remove a smaller thickness, such as thickness $T_2$, of the outer edge 120. In this example, the process flow may then partially etch the outer edge 120 of the ACI loop 100 to form an ACI loop with one or more outer edges that have different thicknesses (as shown below in FIG. 1C), where the partially etched surface area is illustrated with the portion 108. Note that the partial etch process described herein may be tuned to yield a desired space between each inductor loop, where a smaller partial etch (i.e., disposing a thicker inductor loop) may enable an increased electrical conductivity and an improved overall (or absolute) inductance of a package substrate (or the like). Also note that the ACI 100 of FIGS. 1A-1B may include fewer or additional packaging components based on the desired packaging design.

FIG. 1C is an illustration of a 3D perspective view of an ACI loop 150 having different thicknesses $T_1$ and $T_3$ after a portion (i.e., the portion 108 of FIG. 1B) has been etched, according to one embodiment. In one embodiment, the ACI loop 100 shown in FIGS. 1A-1B has been etched to form the ACI loop 150 having two outer edges 110 and 130 that are opposite to each other. In this embodiment, the ACI loop 150 is similar (or the same) as the ACI loop 100 of FIGS. 1A-1B. As shown in FIG. 1C, each of the outer edges 110 and 130 of the ACI loop 150 have different thicknesses $T_1$ and $T_3$ after a portion of the outer edge 110 has been etched. In these embodiments, the ACI loop 150 has the outer edge 130 with the thickness $T_1$ that is greater than the thickness $T_3$ of the outer edge 110. Accordingly, in these embodiments, the difference in thicknesses $T_1$ and $T_3$ of the ACI loop 150 may be used to form one or more trench-shaped via connections in between a plurality of ACI loops, such as the trench-shaped via connections that may be formed in between the ACI loop 150 and any other similar ACI loops that are stacked on the ACI loop 150.

In some embodiments, the ACI loop 150 may be one of a plurality of inductor loops (or ACI loops) of an ACI that is disposed (or formed/embedded) in one or more build-up layers of a package substrate (e.g., as shown in FIG. 2F). For additional embodiments, the simplified process flow of FIGS. 1A-1C may be repeated—multiple times based on the desired packaging design—by disposing and etching another similar ACI loop above (or below) the ACI loop 150 to form an ACI with small spaces (or thicknesses/distances) in between each inductor loop.

Furthermore, after the partial etching as shown in FIG. 1C, the over-plate etch back process described herein may reveal one or more exposed edges/sidewalls from the subsequently etched portion of the ACI loop 150 due to the profile created during the subtractive etch process (e.g., a wet etch process, a dry etch process, etc.), according to some embodiments. As such, in these embodiments, after the etching process, the ACI loop 150 may have a subtractive etch profile on one or more edges/sidewalls/surfaces that includes characteristically different tapers on the etched surfaces—compared to a standard semi-additive process (SAP) (or similar plating patterning process)—as is known in the art. Additionally, it is to be understood that the following process flow figures, as described below, outline the formation of the ACI into a package substrate architecture, however the over-plate etch back process described herein may be implemented for other applications including molded materials as the dielectric, radio-frequency (RF) inductors, power delivery, and so on.

Note that the ACI 150 of FIG. 1C may include fewer or additional packaging components based on the desired packaging design.

FIGS. 2A-2U are illustrations of plan views of a process flow to form an ACI 200 in a plurality of build-up layers of a substrate 205 (or a package substrate), according to some embodiments. These embodiments as shown with respect to FIGS. 2A-2U provide a process flow that implements an over-plated etch back process to form the ACI 200 having a plurality of inductor loops 230-232, where each inductor loop 230-232 has one or more different thicknesses (e.g., as shown in FIG. 1C) after one or more portions of each inductor loop 230-232 has been etched.

In some embodiments, the process flow of FIGS. 2A-2U illustrates the over-plate etch back process that forms the inductor loops 230-232 of the ACI 200 having a plurality of trench openings 215 (or gaps, inductor loop spaces, etc.) used for coupling the via connections in between the inductor loops 230-232 (e.g., as shown in FIG. 2F). As described herein, the process flow may tune the partial etch (or etching step) to enable a desired space that may be defined, as shown in FIG. 2F, by the etched thickness $T_2$ (or the etched space) between the stacked/coupled inductor loops 230-232). Accordingly, in these embodiments, the process flow may initially plate, pattern, and dispose (or embed) a first inductor loop 230 of the ACI 200 on the substrate 205, then etch a portion of the first inductor loop 230 as a smaller partial etch (i.e., a smaller thickness $T_2$) forms a thicker inductor loop which yields improved electrical characteristics (e.g., increased electrical conductivity, inductance, and efficiency), and so on. Note that the process flow illustrated in FIGS. 2A-2U are merely illustrative examples, and thus may include any variety of inductor loop thicknesses, any variety of inductor loop to inductor loop overlaps/configurations, and other packaging applications (e.g., molded materials, dielectric patterning, RF inductors, power delivery, etc.).

Embodiments of the lithographic processes described herein, such as the over-plate etch back process, allow for improved inductor loop to inductor loop alignment, controlled varying thicknesses between each of the inductor loops (i.e., reduced inductor loop to inductor loop spacing), and increased total number of inductor loops with high cross-sectional area compared to existing lithographic technologies, which in turn results in both high absolute inductance and high power efficiency.

Additionally, the embodiments of the process flow described herein enable increasing the thickness of an inductor loop which has various benefits, while also decreasing the inductor loop to inductor loop spacing that is enabled by the partially etched second thickness of such inductor loop which also has various benefits. As described below, the thicker inductor loop with the thinner etched portion of the same inductor loop may be used to form an ACI (e.g., the ACI 200). In such an embodiment, one or more trench-shaped via connection(s) may be used to couple and stack a first inductor loop to a second inductor line. As such, the cross-sectional area of the ACI inductor loops can be greatly increased. The increased cross-sectional area of the inductor loop significantly improves the DC resistance (RDC) of the ACI, a key parameter in determining fully integrated voltage regulators (FIVR) efficiency. In some embodiments, the inductor loops with increased thicknesses (e.g., the first inductor loop 230) used to increase the cross-sectional area of the ACI may also reduce the AC resistance (RAC), and thus increase the quality factor Q of the inductor.

According to an embodiment, an ACI with an increased number of inductor loops and a decreased inductor loop to inductor spacing formed with varying/different thicknesses of each inductor loop may be formed with the over-plate etch back plating and patterning process. One such embodiment that utilizes this process is illustrated and described with respect to FIGS. 2A-2U. FIGS. 2A-2U each include plan view illustrations while FIG. 2F also includes a corresponding cross-sectional view along/across a line of the illustrated inductor loop. In addition, the ACI 200 illustrated in FIGS. 2A-2U includes one or more inductor loops 230-232 that may be similar to the ACI loop 150 of FIG. 1C as described above. In these illustrated embodiments, only the formation of the one or more inductor loops 230-232 of the ACI 200 is shown, however it is to be appreciated that the illustrated features are not limiting, and may be formed with additional features, such as additional loops, layers, vias, pads, and/or transmission lines, at the same time using the same processing operations. Note that well-known features of FIGS. 2A-2U are omitted or simplified in order not to obscure the illustrative implementations.

Referring back to FIG. 2A, the process flow illustrates a substrate 205 having a top surface. According to some embodiments, the substrate 205 may include, but is not limited to, a package substrate, a printed circuit board (PCB), a motherboard, and/or any similar substrate. For one embodiment, the substrate 205 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics (e.g., the dielectrics 206-207 of FIGS. 2H and 2O), where each dielectric layer can be a photosensitive dielectric layer. For some embodiments, holes may be drilled in the PCB 205. For one embodiment, the PCB 205 may also include one or more conductive layers that are disposed in the one or more dielectrics to form the build-up layers of the ACI structure.

In FIG. 2B, according to one embodiment, a seed layer 235 (also referred to as a first seed layer) may be disposed on/over the substrate 205. In this embodiment, the ACI 200 may include the seed layer 235 that is deposited over a top surface of the substrate 205. Additionally, in these embodiments, the ACI 200 may have the seed layer 235 disposed on the substrate 205 using an electroless plating process (or the like). According to other embodiments, any conductive electroless-plated layer 235 may be disposed over the substrate 205, as such the ACI 200 is not limited to a seed layer. Additional embodiments may include forming the seed layer 235 over a dielectric layer (or one of the build-up layers) formed on the substrate 205. In an embodiment, the seed layer 235 may be a copper seed layer or any similar conductive/metallic layer. According to an additional embodiment, the seed layer 235 may be the bottommost layer of a first inductor loop of the ACI 200.

FIG. 2C illustrates a first photoresist 285 may be disposed over the seed layer 235 and patterned to provide openings for the subsequent formation of a first inductor loop (or a first inductor line(s)). According to an embodiment, the first photoresist 285 may be patterned to provide openings through the first photoresist 285 and to expose a top surface of the seed layer 235. For one embodiment, the first photoresist 285 may be a dry-film photoresist (DFR) or any similar photoresist material. In one embodiment, the patterning of the first photoresist 285 may be implemented with lithographic processes (e.g., exposed with a radiation source through a mask (not shown) and developed with a developer).

As shown in FIG. 2D, after the first photoresist 285 has been patterned, a first inductor loop 230 may be disposed (or deposited) over the openings of the first photoresist 285 and the top surface of the seed layer 235. In an embodiment, the first inductor loop 230 may be formed with any suitable deposition process, such as an electrolytic plating process or the like. For one embodiment, the first inductor loop 230 may be a bottommost inductor loop of the ACI 200.

According to an embodiment, the first inductor loop 230 may be formed with any desired shape that may be used for the ACI 200. For example, the illustrated embodiment depicts an inductor line comprised of one or more adjoining (or continuous) conductive lines/traces that form a single inductor loop (or a single inductor coil), where the single inductor loop may have a small space/opening (or an inductor loop opening) formed in between a starting position of the inductor loop and an end position of the inductor loop (e.g., as shown with the inductor loop opening 281 of FIG. 2G that is formed in between the starting position 291 and the end position 292 of the first inductor loop).

It is to be appreciated that the width, the diameter, and/or the thickness of the first inductor loop 230 may be tuned/varied to provide the ACI 200 with desired characteristics (e.g., inductance, resistance, quality factor, efficiency, etc.). The illustrated embodiments include an inductor loop that is substantially rectangular, but embodiments are not limited to such configurations. The use of lithographic patterning, such as the over-plate etch back approach as shown in FIGS. 2E-2H, allows for flexibility in the shape and desired characteristics of the inductor loops of the ACI 200. Accordingly, any desired shape may be selected for the first inductor loop 230.

FIG. 2E illustrates a second photoresist 275 disposed over the first photoresist 285 and the first inductor loop 230. In particular, as shown in FIG. 2E, the second photoresist 275 may be disposed on the first inductor loop 230, covering only a selected portion (or a selected region) of the first inductor loop 230. That is, the selected portion of the first inductor loop 230 may only cover one of the lines of the first inductor loop 230 (as shown below in the cross-sectional view of FIG. 2F).

Based on the plan view of FIG. 2F, the ACI 200 may implement a partial etch process on the first inductor loop 230 to form an etched portion 210, where the etched portion 210 may be formed of one or more lines of the first conductor loop 230 that have been partially etched (i.e., the etched portion 210 is the remaining portion—not the removed portion—of the first inductor loop 230 that was not covered by the second photoresist 275).

Furthermore, as shown in the corresponding cross-sectional view, the first inductor loop 230 has a first thickness $T_1$ that is greater than a third thickness $T_3$, where the third thickness $T_3$ is also the same thickness of the remaining etched portion 210 of the first inductor loop 230, according to some embodiments. For example, after the partial etching of the first inductor loop 230, the first inductor loop 230 has a first line defined as the selected portion (or selected line of the first inductor loop 230) that was not etched, where the thickness of the first line is approximately equal to the first thickness $T_1$.

In addition, the first inductor loop 230 has a corner edge 271 that is formed between the perpendicular intersection of the top surface of the etched portion 210 and the sidewall of the first line of the first inductor loop 230. In one embodiment, the corner edge 271 may be a tapered edge rather a substantially perpendicular edge. The tapered edge may have a tapered edge that is different the than neighboring patterns/edges within the same layer. In addition, the tapered edge that may be formed on the corner edge may have a taper shape that is formed as a result of the subtractive etch profile (that is typically formed after implementing this etching process), where the taper edge may have a minimum undercut that forms slightly underneath the respective etched layer/surface, or a substantial undercut that may be formed as a result of a special treatment of the immersed etch bath (i.e., banking agents and the like). For example, a tapered edge may be formed/patterned within a conductive layer that is disposed between a resist layer and a lower layer. As such, in such an example, the taper may be patterned to have a minimum undercut formed in between the resist and lower layer, and patterned into the conductive layer to form an undercut beneath the resist layer. In an embodiment, this tapered undercut may be in the order of 0.25-0.5× the thickness of the conductive/metallic feature (i.e., if the thickness is roughly 25 um, then the undercut will be roughly 6 to 12 um which may form a more significant undercut that is typically formed with an etch bath).

Likewise, continuing with the above example, the first inductor loop 230 may now have a second line defined as the etched portion 210 (or the etched line(s) 210 of the first inductor loop 230), where the thickness of the second line is approximately equal to the third thickness $T_3$. Accordingly, it is to be appreciated that the illustrated embodiment may show the first inductor loop 230 as having two different conductive layers (i.e., 210 and 230) in order to simplify the illustrations—and not to obscure the illustrative implementations. However, as described above in the simplified process flow of FIGS. 1A-1C, the first line of the first inductor loop may be defined as the initial/first inductor line (or the over-plated line) having the first thickness $T_1$ (i.e., based on the simplified illustrative embodiments, the first line may thus include the overlapping portion/region of the layers 210 and 230). Meanwhile, the second line of the first inductor loop may be formed only after a portion (or a line portion) of the first line has been etched/removed. In such example, the second line (or the etched-back line(s)) is now defined as the subsequently remaining etched portions/regions/lines of the first inductor loop, where the second line is now defined as having the third thickness $T_3$.

Additionally, as described above, the ACI 200 may select a second thickness $T_2$ that may be tuned in order to form (or yield) a trench-shaped opening 215 (also referred to as a desired space between inductor loops, a trench-shaped gap, a desired inductor loop to inductor loop spacing, etc.) between the first inductor loop 230 and a second inductor loop, which may be subsequently coupled and stacked on the first inductor loop 230 (e.g., as shown with the second inductor loop 231 of FIG. 2K). In some embodiments, after the second inductor loop is subsequently disposed above the first inductor loop 230 (e.g., as shown in FIG. 2K), the trench-shaped opening 215 may be defined as the thickness (or depth) between the top surface of the etched portion 210 of the first inductor loop 230 and the bottom surface of the second inductor loop, where the thickness of the trench-shaped opening 215 is approximately equal to the second thickness $T_2$. Accordingly, in these embodiments, the trench-shaped opening 215 may also be defined as the inductor loop to inductor loop spacing of the ACI 200, where such spacing may be approximately 3 um or less (i.e., the trench-shaped opening 215 may be relatively small and only limited by the plating thickness uniformity and/or planarization process).

As shown in the cross-sectional view of FIG. 2F, the first inductor loop 230 of the ACI 200 includes an outer edge 230a having the first thickness $T_1$ and an outer edge 210a having the third thickness $T_3$, where the outer edge 230a is located opposite to the outer edge 210a. In these embodiments, the outer edge 230a has a thickness that is greater than a thickness of the outer edge 210a which thus allows the first inductor loop 230 to have varying/different thicknesses.

In one embodiment, the removed portion of the first inductor loop 230 may be removed with an etching process, such as a wet-etch process, a dry-etch process, and the like. The partial etch thickness (e.g., the second thickness $T_2$) implemented by the etching process should be carefully controlled to ensure uniform thickness of the ACI structure. Typically, for a wet etching process operated via spray nozzles, the etch amount of a feature is driven by the aspect-ratio of the channel. Meanwhile, a wet etch immersion type process may eliminate the aspect-ratio dependence and create a more uniform etch amount across the feature (i.e., create uniform etching independent of feature aspect-ratio). If the etch amount control is problematic using a wet etch process (spray or immersion), then an etch stop layer may be incorporated into the formation of the inductor loop of the ACI structure (e.g., as illustrated by the process flow of FIGS. 3A-3H, in particular, with the etch stop layer 340). Additionally, as shown in the illustrated embodiment, the first inductor loop 230 having different thicknesses $T_1$ and $T_3$ is formed prior to the removal of the photoresists. Such embodiments of the ACI 200 may be referred to as a first inductor loop lithography process—and then the prior illustrated embodiments may be repeated to stack additional inductor loops until the total desired number of inductor loops is completed.

FIG. 2G illustrates stripping the first and second photoresists 285 and 275 and removing the remaining portions of the seed layer 235, thereafter exposing portions of top surface of the substrate 205. According to an embodiment, the seed layer 235 may be removed with a seed etching process. In one embodiment, after stripping/removing the photoresist and seed layers, the first inductor loop 230 has the etched portion 210 and an inductor loop opening 281 (or an inductor loop spacing) that is formed between a starting position 291 and an ending position 292 of the first inductor loop 230.

FIG. 2H illustrates the ACI 200 having a first dielectric 206 that may be disposed (or laminated) over the substrate 205, the etched portion 210, and the first inductor loop 230 (as shown in FIG. 2G). Additionally, in one embodiment, the first dielectric 206 may be planarized and thereby exposing a top surface of the first inductor loop 230 (i.e., the topmost surface of the first inductor loop 230). For one embodiment, the first dielectric 206 may be a polymer material such as, for example, polyimide, epoxy, or build-up film (BF). For one embodiment, the first dielectric 206 may be an ajinomoto build-up film (ABF). In an embodiment, the first dielectric 206 may be one layer in a stack of layers that includes a plurality of additional dielectrics used to form a build-up structure.

In one embodiment, the first dielectric 206 is formed over the exposed features (as shown in FIG. 2G), which include the substrate 205, the etched portions 210, and the first inductor loop 230. According to an embodiment the first dielectric 206 may be formed with any suitable process, such as lamination or slit coating and curing. In an embodiment, the first dielectric 206 is formed to a thickness that will completely cover a top surface of the first inductor loop 230. As opposed to layer formation on crystalline structures (e.g., silicon substrates), each of the dielectric layers may not be highly uniform. Accordingly, the first dielectric 206 may be formed to a thickness that is greater than the first inductor loop 230 to ensure that the proper thickness is reached across the entire substrate 205. When first dielectric 206 is formed above first inductor loop 230, a controlled etching process may then be used to expose the top surface of the first inductor loop 230, as illustrated in FIG. 2H.

In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the top surface of the first inductor loop 230. For example, laser ablation of the first dielectric 206 may be localized proximate to the location of the thicker portion (or thicker line) of the first inductor loop 230. In some embodiments, the thickness of the first dielectric 206 may be minimized in order to reduce the etching time required to expose the first inductor loop 230. In other embodiments, when the thickness of the dielectric can be well controlled, the first inductor loop 230 may extend above the top surface of the first dielectric 206 and the controlled dielectric removal process may be omitted.

In FIG. 2I, according to one embodiment, a second seed layer 236 may be disposed on the first dielectric 206 and the exposed top surface of the first inductor loop 230. In these embodiments, the ACI 200 may form the second seed layer 236 using an electroless plating process (or the like). Note that the second seed layer 236 may be similar to the first seed layer 235 of FIG. 2B.

FIG. 2J illustrates a third photoresist 286 may be disposed over the second seed layer 236 and patterned to provide openings for the subsequent formation of a second inductor loop. According to an embodiment, the third photoresist 286 may be patterned to provide openings through the third photoresist 286 and to expose a top surface of the second seed layer 236. For one embodiment, the third photoresist 286 may be a DFR or any similar photoresist material. In one embodiment, the patterning of the third photoresist 286 may be implemented with lithographic processes (e.g., exposed with a radiation source through a mask (not shown) and developed with a developer). Note that the third photoresist 286 may be similar to the first photoresist 285 of FIG. 2C.

As shown in FIG. 2K, after the third photoresist 286 has been patterned, a second inductor loop 231 may be disposed over the openings of the third photoresist 286 and the top surface of the second seed layer 236. In an embodiment, the second inductor loop 231 may be formed with the similar lithographical process as used for the first inductor loop 230 of FIG. 2D. For some embodiments, the second inductor loop 231 has substantially the same shape and size (e.g., length, diameter, thickness, etc.) as the underlying lower/first inductor loop 230, thereby forming a spiral inductor (or a coil-like inductor). However, additional embodiments are not limited to such configurations, and the second inductor loop 231 may be formed over selected regions of the underlying lower/first inductor loop 230. Furthermore, in alternate embodiments, the second inductor loop 231 may be different than the first inductor loop 230, such as not having the same width, length, and thickness as the first inductor loop 230. Such embodiments may allow for some misalignment between the lower and upper inductor loops. However, the illustrated embodiment depicts the first and second inductor loops 230-231 having approximately the same shape and size, as such it is to be appreciated that these illustrated embodiments may include the second inductor loop 231 as self-aligned on the first inductor loop 230.

FIG. 2L illustrates a fourth photoresist 276 disposed over the third photoresist 286 and the second inductor loop 231. In particular, as shown in FIG. 2L, the fourth photoresist 276 may be disposed on the second inductor loop 231, covering only a selected portion of the second inductor loop 231. That is, the selected portion of the second inductor loop 231 may only cover one of the lines of the second inductor loop 231, where this selected portion may cover a different portion as compared to the selected portion described in FIG. 2E.

Based on the plan view of FIG. 2M, the ACI 200 may repeat the partial etch process, as described above in FIG. 2F, on the second inductor loop 231 to form an etched portion 211, where the etched portion 211 may be formed of one or more lines of the second conductor loop 231 that have been partially etched. Accordingly, as described above, the second inductor loop 231 may also have a first thickness $T_1$ that is greater than a third thickness $T_3$, where the third thickness $T_3$ is also the same thickness of the remaining etched portion 211 of the second inductor loop 231, according to some embodiments.

Additionally, the ACI 200 may select a second thickness $T_2$ that may be tuned in order to form a trench-shaped opening between the second inductor loop 231 and a third inductor loop, which may be subsequently coupled and stacked on the second inductor loop 231 (e.g., as shown with the third inductor loop 232 of FIG. 2R). In these embodiments, the second inductor loop 231 may have one outer edge that has a thickness that is greater than a thickness of another outer edge, which allows the second inductor loop 231 to have varying/different thicknesses. Note that such illustrated embodiment of the ACI 200 may be referred to as a second inductor loop lithography process.

FIG. 2N illustrates stripping the third and fourth photoresists 286 and 276 and removing the remaining portions of the second seed layer 236, thereafter exposing portions of top surface of the first dielectric 206. In one embodiment, after stripping/removing the photoresist and seed layers, the second inductor loop 231 has the etched portion 211 and an inductor loop opening 282 that is formed between a starting position 293 and an ending position 294 of the second inductor loop 231. Furthermore, as shown in FIG. 2N, the double-arrowed line 261 may be used to depict the overlap of the via/line connections between the first inductor loop 230 and the second inductor loop 231.

FIG. 2O illustrates the ACI 200 having a second dielectric 207 that may be disposed over the first dielectric 206, the etched portion 211, and the second inductor loop 231 (as shown in FIG. 2N). Additionally, in one embodiment, the second dielectric 207 may be planarized and thereby exposing a top surface of the second inductor loop 231. In FIG. 2P, according to one embodiment, a third seed layer 237 may be disposed on the second dielectric 207 and the exposed top surface of the second inductor loop 231. Note that the third seed layer 237 may be similar to the first and second seed layers 235-236 of FIGS. 2B and 2H.

FIG. 2Q illustrates a fifth photoresist 287 may be disposed over the third seed layer 236 and patterned to provide openings for the subsequent formation of a third inductor loop. According to an embodiment, the fifth photoresist 287 may be patterned to provide openings through the fifth photoresist 287 and to expose a top surface of the third seed layer 237. For one embodiment, the fifth photoresist 287 may be a DFR or any similar photoresist material. In one embodiment, the patterning of the fifth photoresist 287 may be implemented with lithographic processes similar to the processes implemented for the first and third photoresists 285-286 of FIGS. 2C and 2J.

As shown in FIG. 2R, after the fifth photoresist 287 has been patterned, a third inductor loop 232 may be disposed over the openings of the fifth photoresist 287 and the top surface of the third seed layer 237. In an embodiment, the third inductor loop 232 may be formed with the similar lithographical process as used for the first and second inductor loops 230-231 of FIGS. 2D and 2K. For some embodiments, the third inductor loop 232 has substantially the same shape and size (e.g., length, diameter, thickness, etc.) as the underlying lower first and second inductor loops 230-231.

Figure 2T:
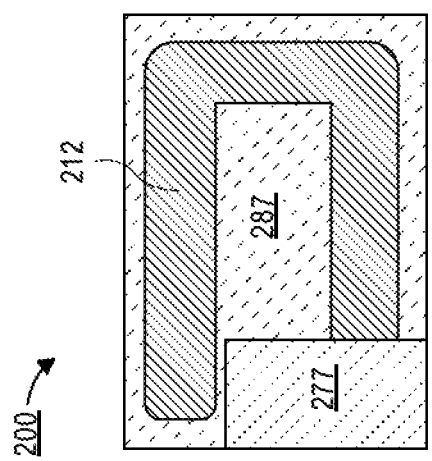
Figure 2S:
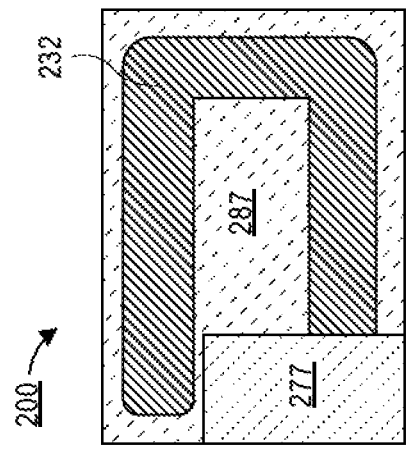

FIG. 2S illustrates a sixth photoresist 277 disposed over the fifth photoresist 287 and the third inductor loop 232. In particular, as shown in FIG. 2S, the sixth photoresist 277 may be disposed on the third inductor loop 232, covering only a selected portion of the third inductor loop 232. That is, the selected portion of the third inductor loop 232 may only cover one of the lines of the third inductor loop 232, where this selected portion may cover a different portion as compared to the selected portions described in FIGS. 2E and 2L.

Based on the plan view of FIG. 2T, the ACI 200 may repeat the partial etch process, as described above in FIGS. 2F and 2M, on the third inductor loop 232 to form an etched portion 212, where the etched portion 212 may be formed of one or more lines of the third conductor loop 232 that have been partially etched. Accordingly, as described above, the third inductor loop 232 may also have a first thickness $T_1$ that is greater than a third thickness $T_3$, where the third thickness $T_3$ is also the same thickness of the remaining etched portion 212 of the third inductor loop 232, according to some embodiments.

Additionally, the ACI 200 may select a second thickness $T_2$ that may be tuned in order to form a trench-shaped opening between the third inductor loop 232 and any other inductor loop, which may be subsequently coupled and stacked on the third inductor loop 232. In these embodiments, the third inductor loop 232 may have one outer edge that has a thickness that is greater than a thickness of another outer edge, which allows the third inductor loop 232 to have varying/different thicknesses. Note that such illustrated embodiment of the ACI 200 may be referred to as a third inductor loop lithography process.

FIG. 2U illustrates stripping the fifth and sixth photoresists 286 and 276 and removing the remaining portions of the third seed layer 237, thereafter exposing portions of top surface of the second dielectric 207. In one embodiment, after stripping/removing the photoresist and seed layers, the third inductor loop 232 has the etched portion 212 and an inductor loop opening 283 that is formed between a starting position 295 and an ending position 296 of the second inductor loop 231. Furthermore, as shown in FIG. 2U, the double-arrowed line 262 may be used to depict the overlap of the via/line connections between the second inductor loop 231 and the third inductor loop 232.

In alternate embodiments, a similar approach to that described above may be implement using a modified lithographic via (LIV) process involving a partial plate followed by a second partial plate, rather than using the over-plate followed by partial etch process. For example, in these alternate embodiments of the modified LIV process, FIGS. 2D, 2K, and 2R may be replaced with a first conductive layer of a first inductor loop (i.e., a first partial plate step), FIGS. 2E, 2L, and 2S may then incorporate an inverse polarity to that outlined portion/region, and FIGS. 2F, 2M, and 2T may lastly be replaced by a second conductive layer of the first inductor loop (i.e., a second partial plate step). Note, however, that the over-plate etch back process may be less dependent on the copper density of the via layer (or a second patterned layer) and may have the potential of creating smaller inductor loop to inductor loop spacings due to a lower variation in the thicknesses.

Also note that the ACI 200 as shown in FIGS. 2A-2U may include fewer or additional packaging components based on the desired packaging design.

FIGS. 3A-3H are illustrations of plan views of a process flow to form an ACI 300 in build-up layers of a substrate 305 with an over-plate etch back process, where the build-up layers of the substrate 305 include an etch stop layer 340, according to some embodiments. These embodiments as shown with respect to FIGS. 3A-3H provide a process flow that implements an over-plated etch back process to form the ACI 300, which is similar to the process flow described above in FIGS. 1-2; however the ACI 300 includes an etch stop layer 340 that is disposed (or sandwiched) in between two conductive layers used to form a first inductor loop (e.g., as shown with the cross-sectional view of the etch stop layer 340 of FIG. 3H).

Figure 3A:
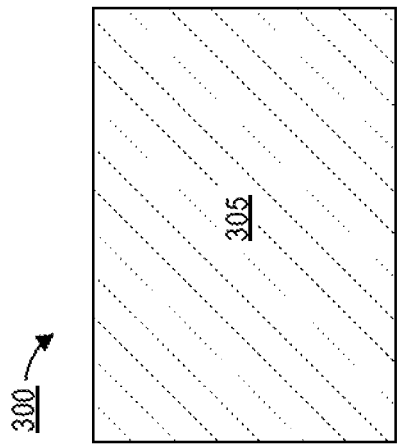
FIGS. 3A-3H are illustrations of plan views of a process flow to form an ACI in build-up layers of a substrate with an over-plate etch back process, where the build-up layers of the substrate include etch stop layers, according to some embodiments.
Figure 3B:
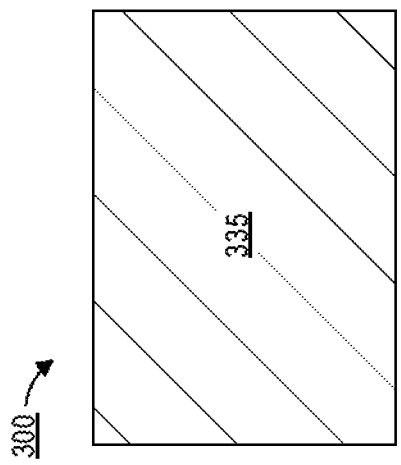
Figure 3C:
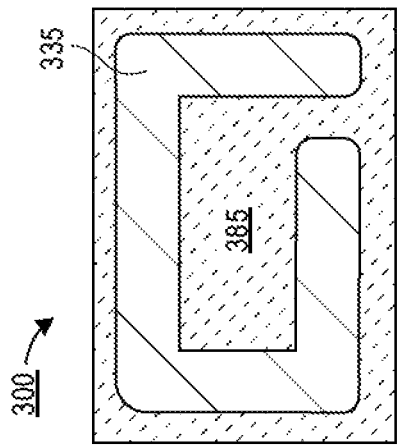
Figure 3D:
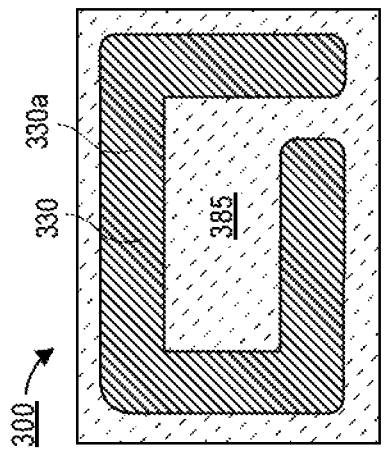
Figure 3E:
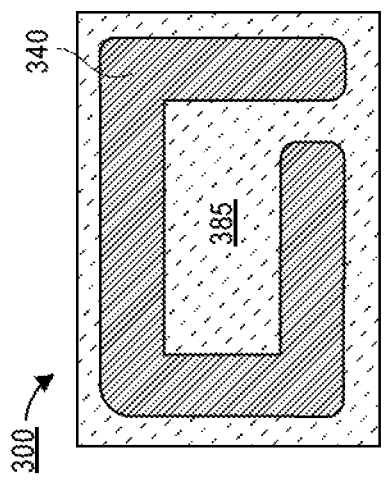
Figure 3F:
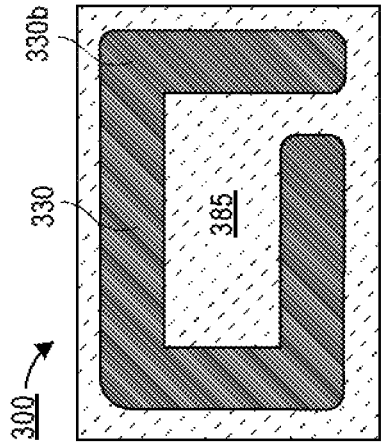
Figure 3H:
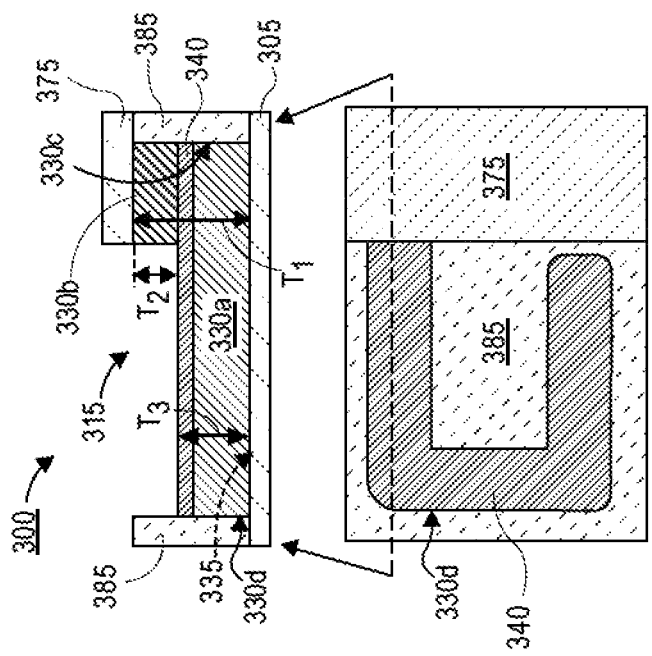
Figure 3G:
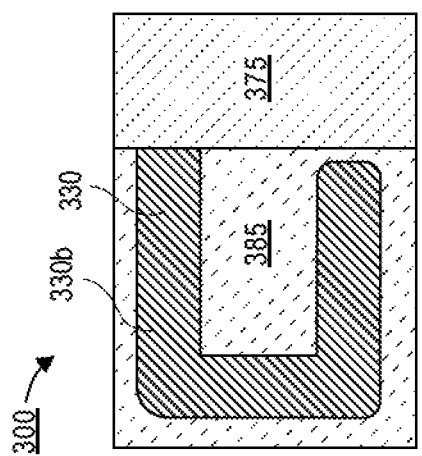

Additionally, in some embodiments, the process flow of FIGS. 3A-3H illustrates the over-plate etch back process that forms the inductor loop 330 of the ACI 300 having a trench opening 315 above the etch stop layer 340 and a first conductive layer 330a of the inductor loop 330 (e.g., as shown in FIG. 3H). The process flow illustrated in FIGS. 3A-3H may be similar to the process flow illustrated in FIGS. 2A-2U, however this process flow includes disposing the etch stop layer 340 within the inductor loop 330 (e.g., as shown in FIG. 3H).

In some embodiments, the process flow of FIGS. 3A-3H may incorporate the etch stop layer 340 by using, for example, an etch stop process to form the inductor loop 330 of the ACI 300. Incorporating the etch stop process may be used to form the ACI 300 when a wet etch process (e.g., spray or immersion etching processes) is having problems controlling the etching thicknesses. As shown in the illustrated embodiments below, the ACI 300 may be formed in the build-up layers of the substrate 305 by combing the over-plate etch back process and the etch stop process. One such embodiment that utilizes this combined process is illustrated and described with respect to FIGS. 3A-3H, which includes disposing the etch layer 340 between one or more conductive layers 330a-b of the inductor loop 330, and then partially etching the inductor loop 330 to remove a portion of the conduction layer 330b that allows the inductor loop 330 to have different thicknesses $T_1$ and $T_3$.

FIGS. 3A-3H each include plan view illustrations while FIG. 2I also includes a corresponding cross-sectional view along/across a line of the illustrated inductor loop. In addition, the ACI 300 illustrated in FIGS. 3A-3H includes an inductor loop 330 that may be similar to the ACI loop 150 of FIG. 1C and the inductor loops 230-232 of FIG. 2A-2U, as described above. In these illustrated embodiments, only the formation of the inductor loop 330 of the ACI 300 is shown, however it is to be appreciated that the illustrated features are not limiting, and may be formed with additional features, such as additional loops, layers, vias, pads, and/or transmission lines, at the same time using the same processing operations. Note that well-known features of FIGS. 2A-2U are omitted or simplified in order not to obscure the illustrative implementations.

Referring back to FIG. 3A, the process flow illustrates a substrate 305 having a top surface. According to some embodiments, the substrate 305 may include, but is not limited to, a package substrate, a PCB, a motherboard, and/or any similar substrate. For one embodiment, the substrate 305 is a PCB. For one embodiment, the PCB is made of an FR-4 glass epoxy base with thin copper foil laminated on both sides. For certain embodiments, a multi-layer PCB can be used, with pre-preg and copper foil used to make additional layers. For example, the multilayer PCB may include one or more dielectrics, where each dielectric layer can be a photosensitive dielectric layer. For some embodiments, holes may be drilled in the PCB 305. For one embodiment, the PCB 305 may also include one or more conductive layers (e.g., Cu) that are disposed in the one or more dielectrics to form the build-up layers of the ACI structure (e.g., the ACI 300).

In FIG. 3B, according to one embodiment, a seed layer 335 may be disposed on/over the substrate 305. In this embodiment, the ACI 300 may include the seed layer 235 that is deposited over a top surface of the substrate 305. Additionally, in these embodiments, the ACI 300 may have the seed layer 335 disposed on the substrate 305 using an electroless plating process (or the like). According to other embodiments, any conductive electroless-plated layer 335 may be disposed over the substrate 305, as such the ACI 300 is not limited to a seed layer. Additional embodiments may include forming the seed layer 335 over a dielectric layer (or one of the build-up layers) formed on the substrate 305. In an embodiment, the seed layer 335 may be a copper seed layer or any similar conductive/metallic layer. According to an additional embodiment, the seed layer 335 may be the bottommost layer of a first inductor loop of the ACI 300.

FIG. 3C illustrates a first photoresist 385 may be disposed over the seed layer 335 and patterned to provide openings for the subsequent formation of a first inductor loop (or a first inductor line(s)). According to an embodiment, the first photoresist 385 may be patterned to provide openings through the first photoresist 385 and to expose a top surface of the seed layer 335. For one embodiment, the first photoresist 385 may be a DFR or any similar photoresist material. In one embodiment, the patterning of the first photoresist 385 may be implemented with lithographic processes (e.g., exposed with a radiation source through a mask (not shown) and developed with a developer).

As shown in FIG. 3D, after the first photoresist 385 has been patterned, a first conductive layer 330a of an inductor loop 330 may be disposed (or deposited) over the openings of the first photoresist 385 and the top surface of the seed layer 335. In an embodiment, the first conductive layer 330a of the inductor loop 330 may be formed with any suitable deposition process, such as an electrolytic plating process or the like. For one embodiment, the first conductive layer 330a may be the bottommost layer of the inductor loop 330 of the ACI 300. It is to be appreciated that that the width, the diameter, and/or the thickness of the first conductive layer 330a of the inductor loop 330 may be tuned/varied to provide the ACI 300 with desired characteristics (e.g., inductance, resistance, quality factor, efficiency, etc.). The illustrated embodiments include a layer of an inductor loop that is substantially rectangular, but embodiments are not limited to such configurations. The use of lithographic plating/patterning processes described herein allow for flexibility in the shape and desired characteristics of the inductor loops of the ACI 300.

As shown in FIG. 3E, the process flow used to form the ACI 300 may include disposing the etch stop layer 340 over the openings of the first photoresist 385 and the top surface of the first conductive layer 330a. In an embodiment, the etch stop layer 340 may be formed with any suitable deposition process, such as an electrolytic plating process or the like. For one embodiment, the etch stop layer 340 of the inductor loop 330 may be a conductive layer disposed/sandwiched between the first conductive layer 330a and a second conductive layer (e.g., as shown below with the second conductive layer 330b of FIG. 3F). In some embodiments, the etch stop layer 340 may include an etch resistant material, such as, but not limited to Ti, Ni, Sn, Zr, Al, ZrAlTi, and/or Al, and/or any of the oxides of these respective etch resistant materials.

In one embodiment, after the etch stop layer 340 has been disposed, FIG. 3F illustrates a second conductive layer 330b of an inductor loop 330 disposed (or deposited) over the openings of the first photoresist 385 and the top surface of the etch stop layer 340. In an embodiment, the second conductive layer 330b of the inductor loop 330 may be formed with any suitable deposition process, such as an electrolytic plating process or the like. For one embodiment, the second conductive layer 330b may be the topmost layer of the inductor loop 330 of the ACI 300. It is to be appreciated that that the width, the diameter, and/or the thickness of the second conductive layer 330b of the inductor loop 330 may be similar to the width, the diameter, and/or the thickness of the first conductive layer 330a.

FIG. 3F illustrates disposing a second photoresist 375 over the inductor loop 330, covering only a selected portion (or a selected region) of the second conductive layer 330b of the inductor loop 330. That is, in one embodiment, the selected portion of the inductor loop 330 may only cover one of the lines of second conductive layer 330b of the inductor loop 330, as such the inductor loop 330 may have one or more exposed lines of the second conductive layer 330b.

Based on the plan view of FIG. 3H, in some embodiments, the ACI 300 may implement a partial etch process on the inductor loop 330 to remove the one or more exposed lines of the second conductive layer 330b that are not covered by the second photoresist 375. In these embodiments, the partial etch process may start etching the exposed lines (or conductive materials/layers) of the second conductive layer 330b and proceed etching through inductor loop 330 until such process is stopped by the top surface of the etch stop layer 340. As described above, the etched thickness $T_2$ defines the inductor loop spacing of the ACI 300 as such the etch stop layer 340 is used to (i) eliminate (or substantially reduced) any over-etching of such inductor loops, and (ii) enable better control over the etched thickness $T_2$.

In one embodiment, as shown in the cross-sectional view of FIG. 3H, the ACI 300 may have an etched portion that includes one or more lines of the first conductive layer 330a and the etch stop layer 340 (i.e., the etched portion is the remaining portion—not the removed portion—of the inductor loop 330). Furthermore, the inductor loop 330 has a first thickness $T_1$ that is greater than a third thickness $T_3$, where the third thickness $T_3$ is also the same thickness of the remaining etched portion of the inductor loop 330 that includes both the etch stop and first conductive layers 340 and 330a, according to some embodiments.

Additionally, as described above, the ACI 300 may select a second thickness $T_2$ that may be tuned in order to form (or yield) a trench-shaped opening 315 (also referred to as a desired space between inductor loops, a trench-shaped gap, a desired inductor loop to inductor loop spacing, etc.) between the first inductor loop 330 and a second inductor loop, which may be subsequently coupled and stacked on the first inductor loop 330 (e.g., as shown with the second inductor loop 231 of FIG. 2K). In some embodiments, after the second inductor loop is subsequently disposed above the first inductor loop 330, the trench-shaped opening 315 may be defined as the thickness between the top surface of the etch stop layer 340 of the first inductor loop 330 and the bottom surface of the second inductor loop, where the thickness of the trench-shaped opening 315 is approximately equal to the second thickness $T_2$. Accordingly, in these embodiments, the trench-shaped opening 315 may also be defined as the inductor loop to inductor loop spacing of the ACI 300, where such spacing may be approximately 3 um or less (i.e., the trench-shaped opening 315 may be relatively small and only limited by the plating thickness uniformity).

As shown in the cross-sectional view of FIG. 3H, the inductor loop 330 of the ACI 300 includes an outer edge 330c having the first thickness $T_1$ and an outer edge 330d having the third thickness $T_3$, where the outer edge 330c is located opposite to the outer edge 330. In these embodiments, the outer edge 330c has a thickness that is greater than a thickness of the outer edge 330d which thus allows the inductor loop 330 to have varying/different thicknesses. Additionally, as shown in the illustrated embodiment, the inductor loop 330 having different thicknesses $T_1$ and $T_3$ is formed prior to the removal of the photoresists 375 and 385. Such embodiments of the ACI 300 may be referred to as a first inductor loop lithography process that includes a first etch stop layer—and then the prior illustrated embodiments may be repeated to stack additional inductor loops until the total desired number of inductor loops is completed.

Note that the ACI 300 as shown in FIGS. 3A-3H may include fewer or additional packaging components based on the desired packaging design.

Figure 4:
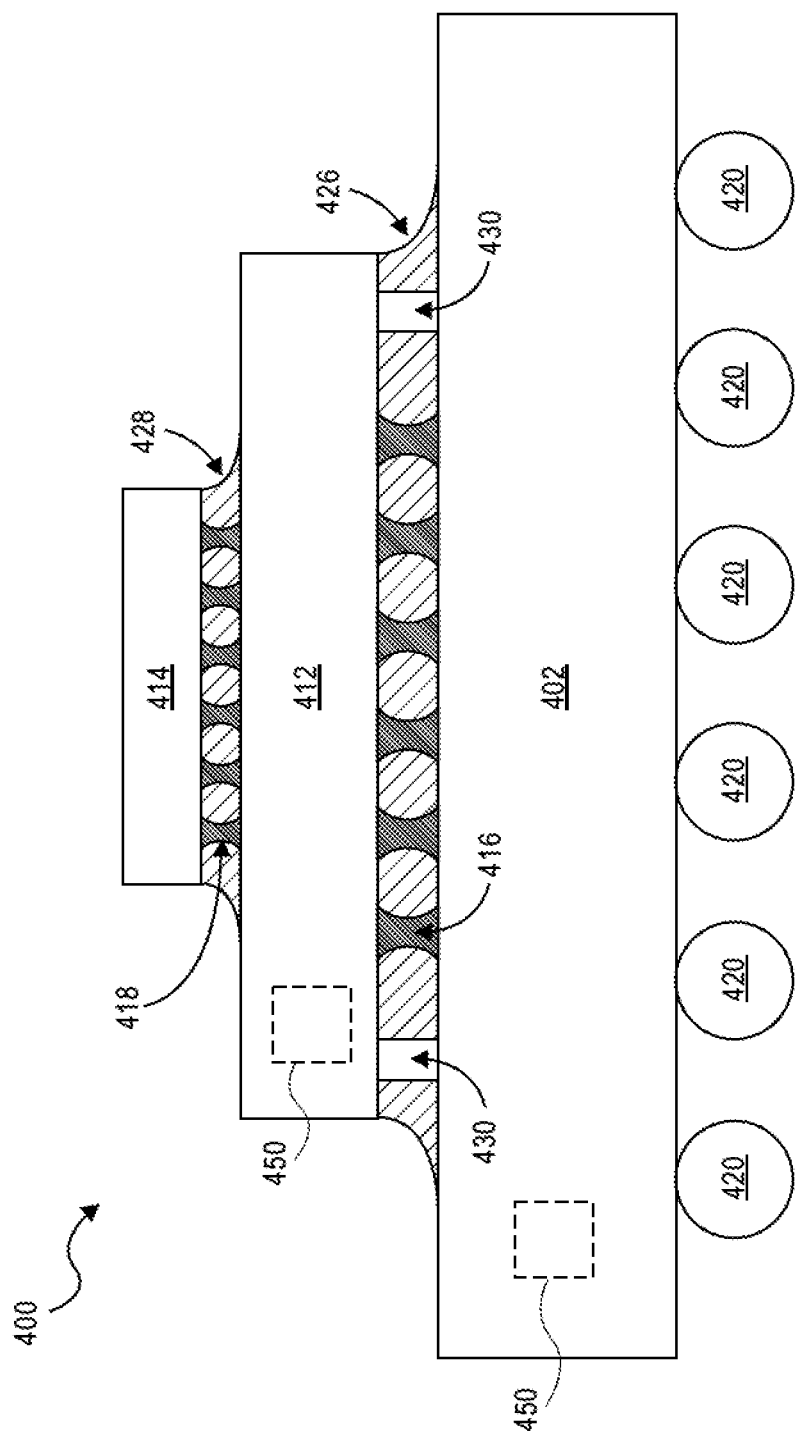
FIG. 4 is an illustration of a cross-sectional view of a semiconductor packaged system including a die, a substrate, a package substrate, and one or more ACIs, according to one embodiment.

FIG. 4 illustrates a semiconductor package 400 including a die 414, a substrate 412 (or an interposer), interconnect structures (e.g., the plurality of bumps disposed below the die 414 and the substrate 412), and the package substrate 402. According to one embodiment, the substrate 412 and/or the package substrate 402 may have build-up structures 450 with one or more embedded ACIs that have one or more inductor loops with different thicknesses as described above.

For one embodiment, the semiconductor package 400 may implement the substrate 412 and/or the package substrate 402 to include a build-up structure 450 (as the build-up structure may be similar to the build-up layers as described herein) having an ACI embedded within the build-up structure 450, where the ACI may include a plurality of inductor loops with different thicknesses as described above. In other embodiments, the build-up structure 450 may include an ACI embedded within the build-up structure 450, where the ACI may include a plurality of inductor loops with different thicknesses and etch stop layers as described above.

For one embodiment, the build-up structure(s) 450 of the substrate 412 and/or the package substrate 402 may be similar to the substrates of FIGS. 1-3. Note that the semiconductor package 400 is not limited to the illustrated semiconductor packaged system, and thus may be designed/formed with fewer, alternate, or additional packaging components and/or with different interconnecting structures. These build-up structures 450 enable the semiconductor package 400 to have improved electrical performances such as enabling the patterning of the ACI having a large number of inductor loops and a high cross sectional area with a small inductor loop to inductor loop spacing (e.g., as shown in FIGS. 1-3), which thereby enables both a high absolute inductance and high efficiency that may facilitate upcoming technology nodes.

According to one embodiment, the semiconductor package 400 is merely one example of an embodiment of a semiconductor packaged system. For one embodiment, the semiconductor package 400 may include a land grid array (LGA) package and/or a pin grid array (PGA) package. For one embodiment, a die 414 (or an integrated circuit die) is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and the package substrate 402 may be coupled using anisotropic conductive film (ACF). For one embodiment, the substrate 412 may be, but is not limited to, a silicon interposer and/or a die with through silicon vias (TSVs). For an alternate embodiment, the semiconductor package 400 may omit the interposer/substrate 412.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a PCB, and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 402. For one embodiment, the PCB 402 may also include conductive layers that comprise copper lines/traces, metallic pads, vias, via pads, planes, and/or holes.

For one embodiment, the die 414 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, Cu).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be molded underfills (MUF).

Note that the semiconductor package 400 may include fewer or additional packaging components based on the desired packaging design.

Figure 5:
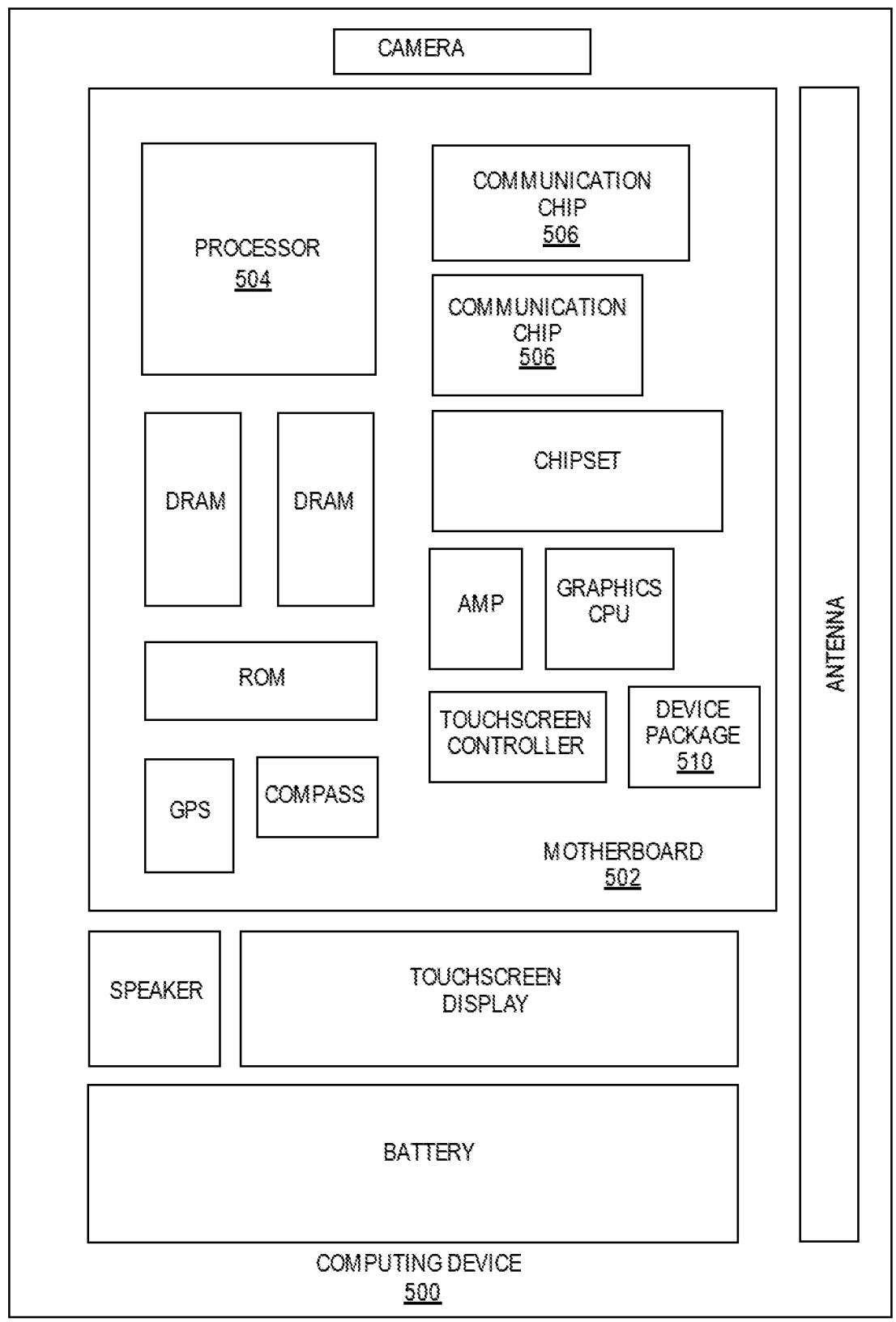
FIG. 5 is an illustration of a schematic block diagram illustrating a computer system that utilizes a package substrate with one or more ACIs that have different thicknesses, according to one embodiment.

FIG. 5 is a schematic block diagram illustrating a computer system 500 that utilizes a device package 510 having an ACI embedded in the build-up layers of such package, where the ACI may have one or more inductor loops, etch stop layers, and/or varying thickness for each inductor loop, according to one embodiment. FIG. 5 illustrates an example of computing device 500. Computing device 500 houses motherboard 502. For one embodiment, motherboard 502 may be similar to the substrates of FIGS. 1-4. Motherboard 502 may include a number of components, including but not limited to processor 504, (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a packaging substrate, and/or a PCB. Device package 510 may include an ACI embedded in the build-up layers of such package, where the ACI may have one or more inductor loops, etch stop layers, and/or varying thickness for each inductor loop (e.g., as illustrated in FIGS. 1-3)—or any other components from the figures described herein—of the computing device 500. The device package 510 may thus provide in-situ component fabrication of a highly efficient, high inductance ACI as described above.

Note that device package 510 may be a single component/device, a subset of components, and/or an entire system, as the materials, features, and components may be limited to device package 510 and/or any other component of the computing device 500 that may need an ACI with a plurality of inductor loops that each have varying thicknesses that may be tuned to yield increase electrical performances and power efficiency (e.g., the motherboard 502, the processor 504, and/or any other component of the computing device 500 may need ACIs as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1: An air core inductor (ACI), comprising: a first inductor loop on a substrate, wherein the first inductor loop has a first line and a second line, and wherein the first line has a first thickness that is greater than a second thickness of the second line; a dielectric over the substrate and the first and second lines of the first inductor loop, wherein the first line has a top surface that is above a top surface of the second line; and a second inductor loop on the dielectric and the first inductor loop, wherein the second inductor loop has a portion of a bottom surface that is coupled to the top surface of the first line of the first inductor loop.

Example 2: The ACI of Example 1, wherein the first inductor loop has a third thickness, and wherein the third thickness is the distance between the top surface of the first line and the top surface of the second line.

Example 3: The ACI of Examples 1-2, wherein the third thickness is approximately equal to an inductor loop to inductor loop space between the top surface of the second line of the first inductor loop and the bottom surface of the second inductor loop.

Example 4: The ACI of Examples 1-3, wherein the first inductor loop has a width that is approximately equal to a width of the second inductor loop.

Example 5: The ACI of Examples 1-4, wherein the first inductor loop includes a corner edge that is located at the perpendicular intersection between the first and second lines, and wherein the corner edge is a tapered edge.

Example 6: The ACI of Examples 1-5, further comprising: a second dielectric over the dielectric, the first inductor loop, and the second inductor loop, wherein the second inductor loop has a first line and a second line, and wherein the first line of the second inductor loop has a first thickness that is greater than a second thickness of the second line of the second inductor loop, wherein the first line has a top surface that is above a top surface of the second line; and a third inductor loop on the second dielectric and the second inductor loop, wherein the third inductor loop has a portion of a bottom surface that is coupled to the top surface of the first line of the second inductor loop.

Example 7: The ACI of Examples 1-6, wherein the first, second, and third inductor loops are stacked on top of each other to form a spiral inductor.

Example 8: The ACI of Examples 1-7, wherein the first, second, and third inductor loops are formed of the same material.

Example 9: A method of forming an ACI, comprising: disposing a first inductor loop on a substrate, wherein the first inductor loop has a first line and a second line, and wherein the first line has a first thickness that is greater than a second thickness of the second line; disposing a dielectric over the substrate and the first and second lines of the first inductor loop, wherein the first line has a top surface that is above a top surface of the second line; and disposing a second inductor loop on the dielectric and the first inductor loop, wherein the second inductor loop has a portion of a bottom surface that is coupled to the top surface of the first line of the first inductor loop.

Example 10: The method of Example 9, wherein disposing the first inductor loop on the substrate further comprises: disposing a first seed layer on the substrate; disposing a first photoresist on the first seed layer; patterning the first photoresist to form an inductor loop opening to expose the first seed layer; disposing a conductive material into the inductor loop opening to form the first inductor loop; disposing a second photoresist over the first photoresist and a first portion of the first inductor loop, wherein the first inductor loop has a second portion that is exposed and not covered by the second photoresist; partially etching the exposed second portion of the first inductor loop to form the second line; removing the first and second photoresists, wherein the first portion of the first inductor loop forms the first line; and removing the exposed first seed layer on the substrate.

Example 11: The method of Examples 9-10, wherein disposing the dielectric over the substrate and the first and second lines of the first inductor loop further comprises: recessing the dielectric to expose the top surface of the first line; and disposing a second seed layer on the dielectric and the exposed top surface of the first line of the first inductor loop.

Example 12: The method of Examples 9-11, wherein the first inductor loop has a third thickness, and wherein the third thickness is the distance between the top surface of the first line and the top surface of the second line.

Example 13: The method of Examples 9-12, wherein the third thickness is approximately equal to an inductor loop to inductor loop space between the top surface of the second line of the first inductor loop and the bottom surface of the second inductor loop.

Example 14: The method of Examples 9-13, wherein the first inductor loop has a width that is approximately equal to a width of the second inductor loop.

Example 15: The method of Examples 9-14, wherein the first inductor loop includes a corner edge that is located at the perpendicular intersection between the first and second lines, and wherein the corner edge is a tapered edge.

Example 16: The method of Examples 9-15, further comprising: disposing a second dielectric over the dielectric, the first inductor loop, and the second inductor loop, wherein the second inductor loop has a first line and a second line, and wherein the first line of the second inductor loop has a first thickness that is greater than a second thickness of the second line of the second inductor loop, wherein the first line has a top surface that is above a top surface of the second line; and disposing a third inductor loop on the second dielectric and the second inductor loop, wherein the third inductor loop has a portion of a bottom surface that is coupled to the top surface of the first line of the second inductor loop.

Example 17: The method of Examples 9-16, wherein the first, second, and third inductor loops are stacked on top of each other to form a spiral inductor.

Example 18: The method of Examples 9-17, wherein the first, second, and third inductor loops are formed of the same material.

Example 19: An ACI, comprising: a first inductor loop on a substrate, wherein the first inductor loop includes a first conductive layer, an etch stop layer, and a second conductive layer, wherein the etch stop layer is between the first conductive layer and the second conductive layer, wherein the first inductor loop has a first thickness that is greater than a second thickness, wherein the first thickness includes the thickness of the first conductive layer, the etch stop layer, and the second conductive layer, and wherein the second thickness includes the thickness of the first conductive layer and the etch stop layer; a dielectric over the substrate and the etch stop and second conductive layers of the first inductor loop, wherein the second conductive layer has a top surface that is above a top surface of the etch stop layer; and a second inductor loop on the dielectric and the first inductor loop, wherein the second inductor loop has a portion of a bottom surface that is coupled to the top surface of the second conductive layer of the first inductor loop.

Example 20: The ACI of Example 19, wherein the first inductor loop has a third thickness, and wherein the third thickness is the distance between the top surface of the second conductive layer and the top surface of the etch stop layer.

Example 21: The ACI of Examples 19-20, wherein the third thickness is approximately equal to an inductor loop to inductor loop space between the top surface of the etch stop layer of the first inductor loop and the bottom surface of the second inductor loop.

Example 22: The ACI of Examples 19-21, wherein the first inductor loop has a width that is approximately equal to a width of the second inductor loop.

Example 23: The ACI of Examples 19-22, wherein the first inductor loop includes a corner edge that is located at the perpendicular intersection between the etch stop layer and the second conductive layer, and wherein the corner edge is a tapered edge.

Example 24: The ACI of Examples 19-23, further comprising: a second dielectric over the dielectric, the first inductor loop, and the second inductor loop, wherein the second inductor loop includes a first conductive layer, an etch stop layer, and a second conductive layer, wherein the etch stop layer is between the first conductive layer and the second conductive layer, wherein the second inductor loop has a first thickness that is greater than a second thickness, wherein the first thickness includes the thickness of the first conductive layer, the etch stop layer, and the second conductive layer, and wherein the second thickness includes the thickness of the first conductive layer and the etch stop layer; and a third inductor loop on the second dielectric and the second inductor loop, wherein the third inductor loop has a portion of a bottom surface that is coupled to the top surface of the second conductive layer of the second inductor loop.

Example 25: The ACI of Examples 19-24, wherein the first, second, and third inductor loops are stacked on top of each other to form a spiral inductor, and wherein the first, second, and third inductor loops are formed of the same material.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An air core inductor (ACI), comprising:
    a first inductor loop on a substrate, wherein the first inductor loop has a first line and a second line, wherein the first line has a first thickness that is greater than a second thickness of the second line, and wherein the first line and the second line are in a same layer;
    a dielectric over the substrate and the first and second lines of the first inductor loop, wherein the first line has an uppermost surface that is above an uppermost surface of the second line; and
    a second inductor loop on the dielectric and the first inductor loop, wherein the second inductor loop has a portion of a bottom surface that is coupled to the uppermost surface of the first line of the first inductor loop.

2. The ACI of claim 1, wherein the first inductor loop has a third thickness, and wherein the third thickness is the distance between the uppermost surface of the first line and the uppermost surface of the second line.

3. The ACI of claim 2, wherein the third thickness is approximately equal to an inductor loop to inductor loop space between the uppermost surface of the second line of the first inductor loop and the bottom surface of the second inductor loop.

4. The ACI of claim 1, wherein the first inductor loop has a width that is approximately equal to a width of the second inductor loop.

5. The ACI of claim 1, wherein the first inductor loop includes a corner edge that is located at the perpendicular intersection between the first and second lines, and wherein the corner edge is a tapered edge.

6. The ACI of claim 1, further comprising:
    a second dielectric over the dielectric, the first inductor loop, and the second inductor loop, wherein the second inductor loop has a first line and a second line, and wherein the first line of the second inductor loop has a first thickness that is greater than a second thickness of the second line of the second inductor loop, wherein the first line has an uppermost surface that is above an uppermost surface of the second line; and
    a third inductor loop on the second dielectric and the second inductor loop, wherein the third inductor loop has a portion of a bottom surface that is coupled to the uppermost surface of the first line of the second inductor loop.

7. The ACI of claim 6, wherein the first, second, and third inductor loops are stacked on top of each other to form a spiral inductor.

8. The ACI of claim 6, wherein the first, second, and third inductor loops are formed of the same material.

9. A method of forming an ACI, comprising:
    disposing a first inductor loop on a substrate, wherein the first inductor loop has a first line and a second line, wherein the first line has a first thickness that is greater than a second thickness of the second line, and wherein the first line and the second line are in a same layer;
    disposing a dielectric over the substrate and the first and second lines of the first inductor loop, wherein the first line has an uppermost surface that is above an uppermost surface of the second line; and
    disposing a second inductor loop on the dielectric and the first inductor loop, wherein the second inductor loop has a portion of a bottom surface that is coupled to the uppermost surface of the first line of the first inductor loop.

10. The method of claim 9, wherein disposing the first inductor loop on the substrate further comprises:
    disposing a first seed layer on the substrate;
    disposing a first photoresist on the first seed layer;
    patterning the first photoresist to form an inductor loop opening to expose the first seed layer;
    disposing a conductive material into the inductor loop opening to form the first inductor loop;
    disposing a second photoresist over the first photoresist and a first portion of the first inductor loop, wherein the first inductor loop has a second portion that is exposed and not covered by the second photoresist;
    partially etching the exposed second portion of the first inductor loop to form the second line;
    removing the first and second photoresists, wherein the first portion of the first inductor loop forms the first line; and
    removing the exposed first seed layer on the substrate.

11. The method of claim 9, wherein disposing the dielectric over the substrate and the first and second lines of the first inductor loop further comprises:
    recessing the dielectric to expose the uppermost surface of the first line; and
    disposing a second seed layer on the dielectric and the exposed uppermost surface of the first line of the first inductor loop.

12. The method of claim 9, wherein the first inductor loop has a third thickness, and wherein the third thickness is the distance between the uppermost surface of the first line and the uppermost surface of the second line.

13. The method of claim 12, wherein the third thickness is approximately equal to an inductor loop to inductor loop space between the uppermost surface of the second line of the first inductor loop and the bottom surface of the second inductor loop.

14. The method of claim 9, wherein the first inductor loop has a width that is approximately equal to a width of the second inductor loop.

15. The method of claim 9, wherein the first inductor loop includes a corner edge that is located at the perpendicular intersection between the first and second lines, and wherein the corner edge is a tapered edge.

16. The method of claim 9, further comprising:
    disposing a second dielectric over the dielectric, the first inductor loop, and the second inductor loop, wherein the second inductor loop has a first line and a second line, and wherein the first line of the second inductor loop has a first thickness that is greater than a second thickness of the second line of the second inductor loop, wherein the first line has an uppermost surface that is above an uppermost surface of the second line; and
    disposing a third inductor loop on the second dielectric and the second inductor loop, wherein the third inductor loop has a portion of a bottom surface that is coupled to the uppermost surface of the first line of the second inductor loop.

17. The method of claim 16, wherein the first, second, and third inductor loops are stacked on top of each other to form a spiral inductor.

18. The method of claim 16, wherein the first, second, and third inductor loops are formed of the same material.

19. An ACI, comprising:
- a first inductor loop on a substrate, wherein the first inductor loop includes a first conductive layer, an etch stop layer, and a second conductive layer, wherein the etch stop layer is between the first conductive layer and the second conductive layer, wherein the first inductor loop has a first thickness that is greater than a second thickness, wherein the first thickness includes the thickness of the first conductive layer, the etch stop layer, and the second conductive layer, and wherein the second thickness includes the thickness of the first conductive layer and the etch stop layer;
- a dielectric over the substrate and the etch stop and second conductive layers of the first inductor loop, wherein the second conductive layer has a top surface that is above a top surface of the etch stop layer; and
- a second inductor loop on the dielectric and the first inductor loop, wherein the second inductor loop has a portion of a bottom surface that is coupled to the top surface of the second conductive layer of the first inductor loop.

20. The ACI of claim 19, wherein the first inductor loop has a third thickness, and wherein the third thickness is the distance between the top surface of the second conductive layer and the top surface of the etch stop layer.

21. The ACI of claim 20, wherein the third thickness is approximately equal to an inductor loop to inductor loop space between the top surface of the etch stop layer of the first inductor loop and the bottom surface of the second inductor loop.

22. The ACI of claim 19, wherein the first inductor loop has a width that is approximately equal to a width of the second inductor loop.

23. The ACI of claim 19, wherein the first inductor loop includes a corner edge that is located at the perpendicular intersection between the etch stop layer and the second conductive layer, and wherein the corner edge is a tapered edge.

24. The ACI of claim 19, further comprising:
- a second dielectric over the dielectric, the first inductor loop, and the second inductor loop, wherein the second inductor loop includes a first conductive layer, an etch stop layer, and a second conductive layer, wherein the etch stop layer is between the first conductive layer and the second conductive layer, wherein the second inductor loop has a first thickness that is greater than a second thickness, wherein the first thickness includes the thickness of the first conductive layer, the etch stop layer, and the second conductive layer, and wherein the second thickness includes the thickness of the first conductive layer and the etch stop layer; and
- a third inductor loop on the second dielectric and the second inductor loop, wherein the third inductor loop has a portion of a bottom surface that is coupled to the top surface of the second conductive layer of the second inductor loop.

25. The ACI of claim 24, wherein the first, second, and third inductor loops are stacked on top of each other to form a spiral inductor, and wherein the first, second, and third inductor loops are formed of the same material.

* * * * *